United States Patent
Fuhrmann et al.

(10) Patent No.: US 10,211,370 B2
(45) Date of Patent: Feb. 19, 2019

(54) INFRARED LED

(71) Applicant: AZUR SPACE Solar Power GmbH, Heilbronn (DE)

(72) Inventors: Daniel Fuhrmann, Heilbronn (DE); Matthias Meusel, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/916,768

(22) Filed: Mar. 9, 2018

(65) Prior Publication Data

US 2018/0198021 A1    Jul. 12, 2018

Related U.S. Application Data

(63) Continuation of application No. PCT/EP2016/001348, filed on Aug. 5, 2016.

(30) Foreign Application Priority Data

Sep. 11, 2015    (DE) .......... 10 2015 011 635

(51) Int. Cl.
  *H01L 33/06* (2010.01)
  *H01L 33/04* (2010.01)
  (Continued)

(52) U.S. Cl.
  CPC ............ *H01L 33/06* (2013.01); *H01L 33/025* (2013.01); *H01L 33/04* (2013.01); *H01L 33/14* (2013.01); *H01L 33/30* (2013.01); *H01L 33/305* (2013.01)

(58) Field of Classification Search
  CPC ..... H01L 33/06; H01L 33/305; H01L 33/025; H01L 33/04; H01L 33/30; H01L 33/14
  See application file for complete search history.

(56) References Cited

U.S. PATENT DOCUMENTS 5,073,806 A * 12/1991 Idei .................. H01L 27/153
                                                          257/96
5,936,266 A    8/1999 Holonyak, Jr. et al.
(Continued)

FOREIGN PATENT DOCUMENTS

DE         102 11 531 A1    10/2003
DE    10 2006 057 747 A1     4/2008
(Continued)

OTHER PUBLICATIONS

T. A. Richard et al. "High current density carbon-doped strained-layer GaAs (p+)—InGaAs(n+)—GaAs(+)p-n tunnel diodes", Dec. 1993, Applied Physics Letters, vol. 63, pp. 3613-3615.*
(Continued)

*Primary Examiner* — William Coleman
(74) *Attorney, Agent, or Firm* — Muncy, Geissler, Olds & Lowe, P.C.

(57) ABSTRACT

An infrared LED having a monolithic and stacked structure, having an n-doped base substrate, which includes GaAs, a lower cladding layer, an active layer for generating infrared radiation, an upper cladding layer, a current distribution layer and an upper contact layer. The layers being preferably disposed in the specified order. A first tunnel diode is disposed between the upper cladding layer and the current distribution layer, and the current distribution layer predominantly including an n-doped, Ga-containing layer having a Ga content>1%.

14 Claims, 1 Drawing Sheet

(51) Int. Cl.
*H01L 33/14* (2010.01)
*H01L 33/30* (2010.01)
*H01L 33/02* (2010.01)

(56) References Cited

U.S. PATENT DOCUMENTS

| | | |
|---|---|---|
| 6,869,820 B2 | 3/2005 | Chen |
| 7,649,193 B2 | 1/2010 | Wirth |
| 7,994,519 B2 | 8/2011 | Fehrer et al. |
| 8,194,712 B2 | 6/2012 | Müller et al. |
| 9,853,188 B2 | 12/2017 | Sundgren et al. |
| 2004/0013146 A1 | 1/2004 | Ungar |
| 2005/0173724 A1 | 8/2005 | Liu |
| 2007/0075327 A1 | 4/2007 | Arai et al. |
| 2007/0249140 A1 | 10/2007 | Dross et al. |
| 2009/0280635 A1 | 11/2009 | Mathew et al. |
| 2010/0032648 A1 | 2/2010 | Lu et al. |
| 2010/0224860 A1 | 9/2010 | Ibbetson et al. |
| 2010/0310775 A1 | 12/2010 | Bedell et al. |
| 2011/0049542 A1 | 3/2011 | Tanaka et al. |
| 2011/0062466 A1* | 3/2011 | Tanaka ............... C30B 19/00 257/94 |
| 2013/0016752 A1* | 1/2013 | Lell ................. H01S 5/4043 372/50.1 |

FOREIGN PATENT DOCUMENTS

| | | |
|---|---|---|
| DE | 10 2007 032 555 A1 | 1/2009 |
| DE | 10 2010 014 667 A1 | 10/2011 |
| EP | 2 009 753 A1 | 12/2008 |

OTHER PUBLICATIONS

A. R. Sugg et al., "n-p(p+-n+)-n AlyGa1-yAs—GaAs—InxGa1-xAs quantum-well laser with p+-n+ GaAs—InGaAs tunnel contact on n-GaAs", May 1993, Applied Physics Letters, vol. 62, pp. 2510-2512.*

Yu et al., "MOCVD growth of strain-compensated multi-quantum wells light emitting diode," Vacuum, vol. 69, pp. 489-493 (2003).

* cited by examiner

INFRARED LED

This nonprovisional application is a continuation of International Application No. PCT/EP2016/001348, which was filed on Aug. 5, 2016, and which claims priority to German Patent Application No. 10 2015 011 635.5, which was filed in Germany on Sep. 11, 2015, and which are both herein incorporated by reference.

BACKGROUND OF THE INVENTION

Field of the Invention

The present invention relates to an infrared LED.

Description of the Background Art

To increase the efficiency of an infrared LED, the epitaxial structure of the infrared LED may be optimized in different ways.

An infrared LED having an epitaxial structure is known from DE 10 2010 014 667 A1, which corresponds to U.S. Pat. No. 9,853,188, which includes a current spreading layer, 500 nm thick and made from one or multiple p-doped AlGaAs layers, between a carrier layer and a p-doped cladding layer.

An infrared LED epitaxial structure is known from DE 102 11 531 A1, which corresponds to U.S. Pat. No. 6,869,820, which, in addition to a plurality of semiconductor layers made from II-V-group compounds, also includes a highly reflective metal layer as a reflector for the purpose of increasing efficiency.

The article, "MOCVD growth of strain-compensated multi-quantum wells light emitting diode" by Yongqin Yu et al., Vacuum, Volume 69, pages 489-493, published in 2003, investigates the quantum efficiency and optical output power of infrared light-emitting diodes, which each include different MQW active layers made from InGaAs/GaAsP, which were grown via low-pressure CVD.

According to US 2007/0075327, a p-doped II-V semiconductor layer, contaminated with hydrogen atoms, is disposed as a buffer layer between a p-doped cladding layer and a p-doped contact layer, to prevent the diffusion of the dopants between the contact layer and the cladding layer.

A multibeam laser diode is known from EP 2 009 753 A1, which corresponds to U.S. Pat. No. 8,194,712, which includes laser stacks arranged one above the other and electrically series-connected by tunnel transitions. Different LED semiconductor layer stacks are also known from DE 10 2006 057 747 A1 (which corresponds to U.S. Pat. No. 7,649,193) and from US 2005/0173 724, DE 10 2007 032 555 A1 (which corresponds to U.S. Pat. No. 7,994,519) and U.S. Pat. No. 5,936,266.

SUMMARY OF THE INVENTION

It is therefore an object of the present invention to provide an infrared LED.

According to an exemplary embodiment of the invention, an infrared LED comprises a monolithic, stacked an epitaxially grown structure, including an n-doped base substrate, which includes GaAs, a lower cladding layer, an active layer for generating infrared radiation, an upper cladding layer, a current distribution layer and an upper contact layer, the layers being disposed in the specified order, and a first tunnel diode being disposed between the upper cladding layer and the current distribution layer, and the current distribution layer predominantly including an n-doped, Ga-containing layer having a Ga content>1%.

The active layer can be designed as an MQW layer, it being preferred to design the active layer as an $In_xGa_{1-x}As/GaAs_{1-y}P_y$ multiple quantum well structure, where $0.1 \leq x \leq 0.2$ and $0.1 \leq y \leq 0.3$. The MQW layer can contain one or multiple layers, and the one or multiple MQW layers have a lower bandgap energy than the lower and/or the upper cladding layer. The tunnel diode can be transparent to the infrared radiation generated in the active layer.

A multiple quantum well structure (MQW) can be referred to as an MQW layer, the designation quantum well structure not including an indication of the dimensionality of the quantization. The designation of quantum well structure covers, among other things, quantum wells, quantum wires and quantum dots and any combination of the aforementioned structures. Infrared light can be generated within the MQW structure, provided that a suitable voltage is applied to the two contact layers. The light is preferably coupled out by the upper contact layer.

The lower cladding layer can have an n doping, and/or the upper cladding layer can have a p doping.

Due to the formation of the tunnel diode layers for the first tunnel diode between the p-doped cladding layer and the current distribution layer, an n-doped current distribution layer may be particularly easily implemented from n-AlGaAs. It has surprisingly been shown that, due to the introduction of a tunnel diode, the layer thicknesses and doping in an infrared LED may be set in such a way that the tunnel diode is sufficiently transparent to the infrared radiation. Based on the higher mobility of the charge carriers within the n-doped layer, compared to a p-doped current distribution layer, the same current distribution or the same effect may be achieved even at a lesser layer thickness. Studies have shown that $p-Al_{26}GaAs$ has a mobility of approximately $\mu_p=100$ cm$^2$/Vs, while the mobility within $n-Al_{26}GaAs$ is approximately $\mu_n=750$ cm$^2$/Vs.

Because of the lower absorption coefficient of the n-AlGaAs current distribution layer, compared to the p-AlGaAs layer below the bandgap, the light power of the LED may be increased with an n-AlGaAs current distribution layer instead of a p-AlGaAs current distribution layer. The doping for the n-AlGaAs current distribution layer may be increased hereby in comparison to a p-AlGaAs current distribution layer. Due to the increased doping and the reduced lateral resistance in the n-AlGaAs current distribution layer, compared to a p-AlGaAs current distribution layer, the lateral distribution of the current, i.e., the homogeneity within the n-current distribution layer, may be increased. The current distribution layer can have an absorption coefficient of less than 150/cm for the radiation generated in the active layer. The lower the absorption coefficient, the higher the efficiency of the infrared LED.

In an embodiment, the n-doped current distribution layer can be made from GaAs or AlGaAs or InGaP. The current distribution layer can include an n-doped $Al_xGa_{1-x}As$ layer having an Al content x between 0% and 20%.

In an embodiment, the n-doped current distribution layer can have a thickness of 0.1 μm to 4.0 μm. The current distribution layer can have a thickness between 0.5 μm and 2.5 μm and preferably a maximum thickness of 1.5 μm.

In an embodiment, the current distribution layer can have an n-dopant concentration greater than 1.0E18 N/cm$^3$. The n-dopant concentration of the current distribution layer can be in the range of 4E17 N/cm$^3$ to 5 E18 N/cm$^3$.

The current distribution layer can have a layer resistance $R_\square < 400\Omega$ or $R_\square < 75\Omega$.

In an embodiment, the current distribution layer can have a thickness in the rang of 0.1 μm to 5 μm and/or a $R_\square$ in the range of 4Ω to 350Ω, or the current distribution layer has a thickness in the range of 0.2 μm to 1.5 μm and/or a layer resistance $R_\square$ in the range of 4Ω to 75Ω. In the present case, layer resistance $R_\square$ is understood to be the specific surface resistance.

An advantage of the device according to the invention is a reduced size as well as a higher light power and a reduction in manufacturing costs. Another advantage of the device according to the present invention is that an n-doped GaAs substrate may continue to be used to manufacture infrared LEDs, due to the use of an upper n-doped current distribution layer in combination with a tunnel diode between the current distribution layer and the upper cladding layer. Without the use of the first tunnel diode according to the invention, more expensive and lower-quality p-GaAs substrates would have to be used to manufacture an LED.

In an embodiment, a second tunnel diode can be disposed between the current distribution layer and the upper contact layer, and the upper contact layer is provided with a p-doped design, so that, with respect to the connections to the outside, an interface of the structure results, which is identical to a classic infrared LED which does not have any tunnel diode layers.

According to an embodiment, the lower cladding layer and/or the upper cladding layer is/are made from GaAs or from AlGaAs or from InGaAsP or from GaAsP or from InGaP or from AlInGaP, or it predominantly includes a compound made from GaAs or from AlGaAs or from InGaAsP or from GaAsP or from InGaP or from AlInGaP.

In an embodiment, the thickness of the active layer or the thickness of the MQW layer can be designed to be between 15 nm and 350 nm or between 30 nm and 300 nm or between 200 nm and 400 nm. In an embodiment, the thickness of the active layer or the thickness of the MQW layer is about 300 nm. The tunnel diodes can have a thickness between 30 nm and 150 nm, a thickness between 45 nm and 55 nm, and or a thickness of about 50 nm. It is advantageous to design the tunnel diode to be thinner than 150 nm for the purpose of reducing the absorption losses of the infrared light in the tunnel diode and to increase the light power of the infrared LED. For the highly doped semiconductor layers, in particular, which have a certain electrical conductivity, the absorption losses according to the Drude-Lorentz Theory are particularly high in the infrared spectral range.

An advantage is that more than 4 μm of layer thickness may be spared, compared to usual thicknesses of p-doped current distribution layers, which corresponds to a savings of approximately 35% and, even with the additional tunnel diode, contributes to a significant reduction in the installation height of the infrared LED and to a higher light power.

In an embodiment, a lower n-doped contact layer can be formed below the n-doped base substrate. In an embodiment, the first tunnel diode and/or the second tunnel diode can include an As-containing layer, the As-containing layer being doped with carbon. In an embodiment, the first tunnel diode and/or the second tunnel diode can include a P-containing layer, the P-containing layer being doped with tellurium. The first tunnel diode and/or the second tunnel diode can include at least one n-doped layer having a dopant concentration $>3\times10^{18}$ N/cm$^3$ and at least one p-doped layer having a dopant concentration $>1\times10^{19}$ N/cm$^3$.

For example, in the case of the first tunnel diode, situated on the P-cladding layer, a p-doped tunnel diode layer comes first, followed by an n-doped tunnel diode layer, which is then followed by the n-current distribution layer. In the case of the second tunnel diode, the sequence of the polarity of the doping layers is reversed. The n-current distribution layer is followed by an n-tunnel diode layer, which is then followed by a p-tunnel diode layer, after which comes the p-contact layer.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
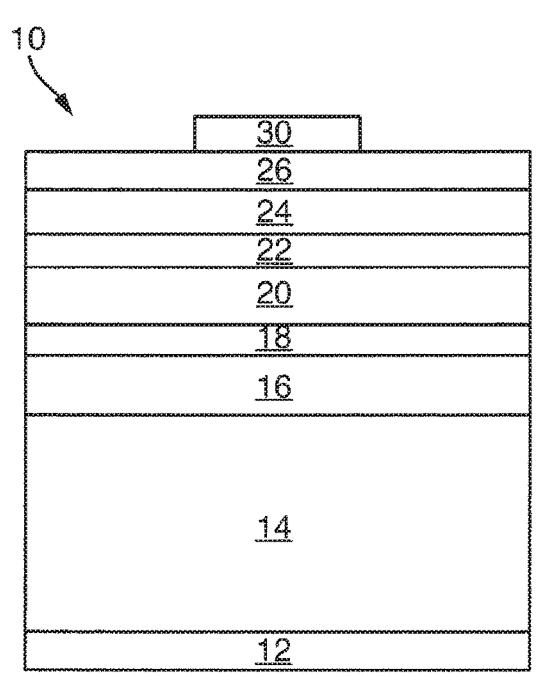
FIG. 1 shows a schematic view of an embodiment of an infrared LED according to the invention.

The representation in FIG. 1 shows a view of an embodiment, comprising an infrared LED having a monolithic, stacked, epitaxially grown structure 10, which includes, in the following order, an n-doped base substrate 14 made from GaAs, an n-doped cladding layer 16, an MQW layer 18, a p-doped cladding layer 20, a first tunnel diode 22, an n-doped current distribution layer 24 and a second n-doped contact layer 26. In processing the epitaxially grown structure into LED chips, a first contact 12 as well as a second n-contact 30 are applied during the further course of the process.

Figure 2:
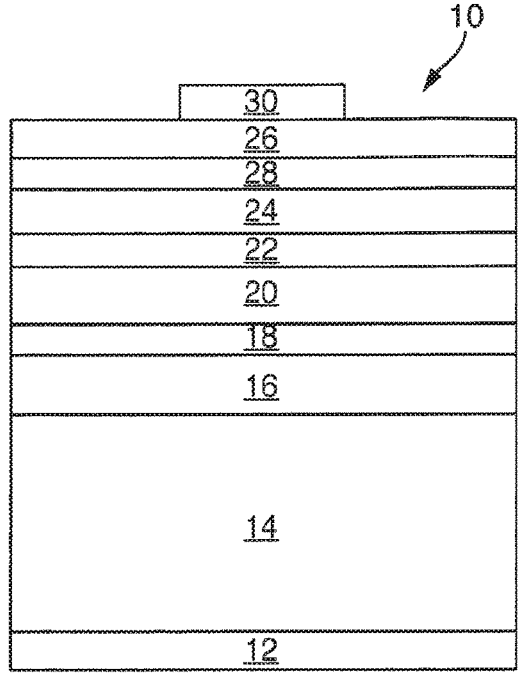
FIG. 2 shows a schematic view of an embodiment of an infrared LED according to the invention.
Figure 3:
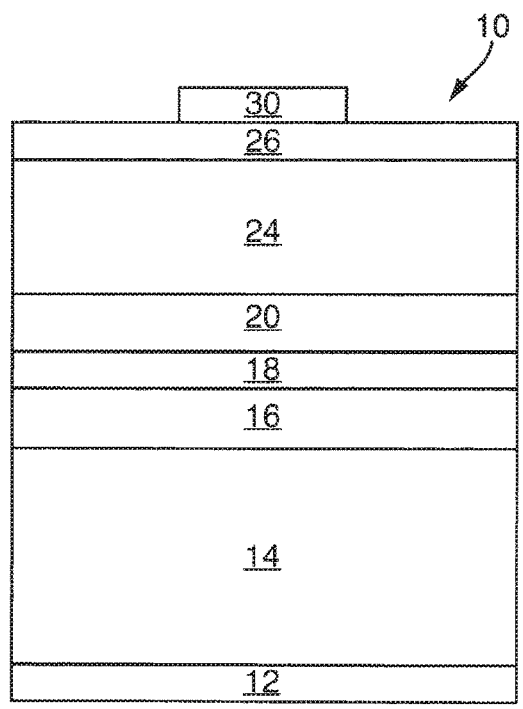
FIG. 3 shows a schematic view of an infrared LED according to the conventional art.

An embodiment of an infrared LED is illustrated in the representation in FIG. 2, which has an epitaxially grown structure 10. Only the differences from the illustration in FIG. 1 are explained below. Current distribution layer 24 is followed by a second tunnel diode 28, and subsequent upper contact layer 26 is provided with a p-doped design. Subsequent contact 30 is therefore also designed as a metal contact to a p-semiconductor layer. The contacts of infrared LED structure 10 according to the invention can correspond hereby to the contacts of an infrared LED structure 10 known according to the prior art without tunnel diode 22 and n-doped current distribution layer 24, as illustrated in FIG. 3. It is understood that current distribution layer 24 according to the prior art in FIG. 3 is p-doped.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An infrared LED having a monolithic and stacked structure, the infrared LED comprising:

a n-doped base substrate that includes GaAs;

a lower cladding layer;

an active layer for generating infrared radiation;
an upper cladding layer;
a current distribution layer;
an upper contact layer that is epitaxially grown; and
a first tunnel diode disposed between the upper cladding layer and the current distribution layer,
wherein the current distribution layer includes a n-doped Ga-containing layer having a Ga content>1%, the current distribution layer having a layer resistance $R_\square$<75Ω, the current distribution layer being made from GaAs or AlGaAs or InGaP, and
wherein the first tunnel diode has a thickness between 30 nm and 150 nm and includes an As-containing p layer doped with carbon having a dopant concentration>1×$10^{19}$ N/cm$^3$, and the first tunnel diode includes a P-containing n layer doped with tellurium having a dopant concentration>3×$10^{18}$ N/cm$^3$.

2. The infrared LED according to claim 1, wherein a second tunnel diode is arranged between the current distribution layer and the upper contact layer, and wherein the upper contact layer is p-doped.

3. The infrared LED according to claim 1, wherein the lower cladding layer includes a compound made from GaAs or from AlGaAs or from InGaAsP or from GaAsP or from InGaP or from AlInGaP.

4. The infrared LED according to claim 1, wherein the upper cladding layer includes a compound made from GaAs or from AlGaAs or from InGaAsP or from GaAsP or from InGaP or from AlInGaP.

5. The infrared LED according to claim 1, wherein the active layer is made from a multiple quantum well structure and has a thickness between 15 nm and 350 nm or between 30 nm and 300 nm.

6. The infrared LED according to claim 1, wherein the current distribution layer has a thickness between 0.1 μm and 3.0 μm.

7. The infrared LED according to claim 1, wherein the current distribution layer includes a n-doped $Al_xGa_{1-x}As$ layer having an Al content x between 0% and 20%.

8. The infrared LED according to claim 1, wherein the current distribution layer has a n-dopant concentration>1.0E18 N/cm$^3$.

9. The infrared LED according to claim 1, wherein the active layer is made from an $In_xGa_{1-x}As/GaAs_{1-y}P_y$ multiple quantum well structure, where 0.1≤x≤0.2 and 0.1≤y≤0.3.

10. The infrared LED according to claim 1, wherein the lower cladding layer has a n doping, or wherein the upper cladding layer has a p doping.

11. The infrared LED according to claim 1, wherein the tunnel diode is transparent to the radiation generated in the active layer.

12. The infrared LED according to claim 1, wherein the current distribution layer has an absorption coefficient of less than 150/cm for the radiation generated in the active layer.

13. The infrared LED according to claim 2, wherein the first tunnel diode or the second tunnel diode includes an As-containing layer, the As-containing layer being doped with carbon, or includes a P-containing layer, the P-containing layer being doped with tellurium.

14. The infrared LED according to claim 2, wherein the first tunnel diode or the second tunnel diode includes a n-doped layer having a dopant concentration>3×$10^{18}$ N/cm$^3$ and a p-doped layer having a dopant concentration>1×$10^{19}$ N/cm$^3$.

* * * * *